(12) United States Patent
Noh

(10) Patent No.: US 8,971,109 B2
(45) Date of Patent: Mar. 3, 2015

(54) SEMICONDUCTOR MEMORY DEVICE AND METHOD OF OPERATING THE SAME

(75) Inventor: Yoo Hyun Noh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 315 days.

(21) Appl. No.: 13/601,737

(22) Filed: Aug. 31, 2012

(65) Prior Publication Data

US 2013/0163359 A1 Jun. 27, 2013

(30) Foreign Application Priority Data

Dec. 22, 2011 (KR) ........................ 10-2011-0140195

(51) Int. Cl.
*G11C 16/04* (2006.01)

(52) U.S. Cl.
USPC ................................. 365/185.02; 365/185.29

(58) Field of Classification Search
USPC ............................. 365/185.02, 185.29, 185.17
See application file for complete search history.

(56) References Cited

U.S. PATENT DOCUMENTS

2011/0286279 A1* 11/2011 Lei et al. ................... 365/185.19
2012/0051141 A1* 3/2012 Lee et al. ................... 365/185.18

* cited by examiner

*Primary Examiner* — Vu Le
(74) *Attorney, Agent, or Firm* — William Park & Associates Patent Ltd.

(57) ABSTRACT

A semiconductor memory device and a method of operating the same are provided. The method includes performing an overall erase operation such that each threshold voltage of all memory cells connected to even word lines and odd word lines in a selected memory cell block are lower than a first target level, performing an erase operation such that each threshold voltage of the memory cells connected to the even word lines are lower than a second target level which is lower than the first target level, and performing an erase operation such that each threshold voltage of the memory cells connected to the odd word lines are lower than the second target level.

20 Claims, 4 Drawing Sheets

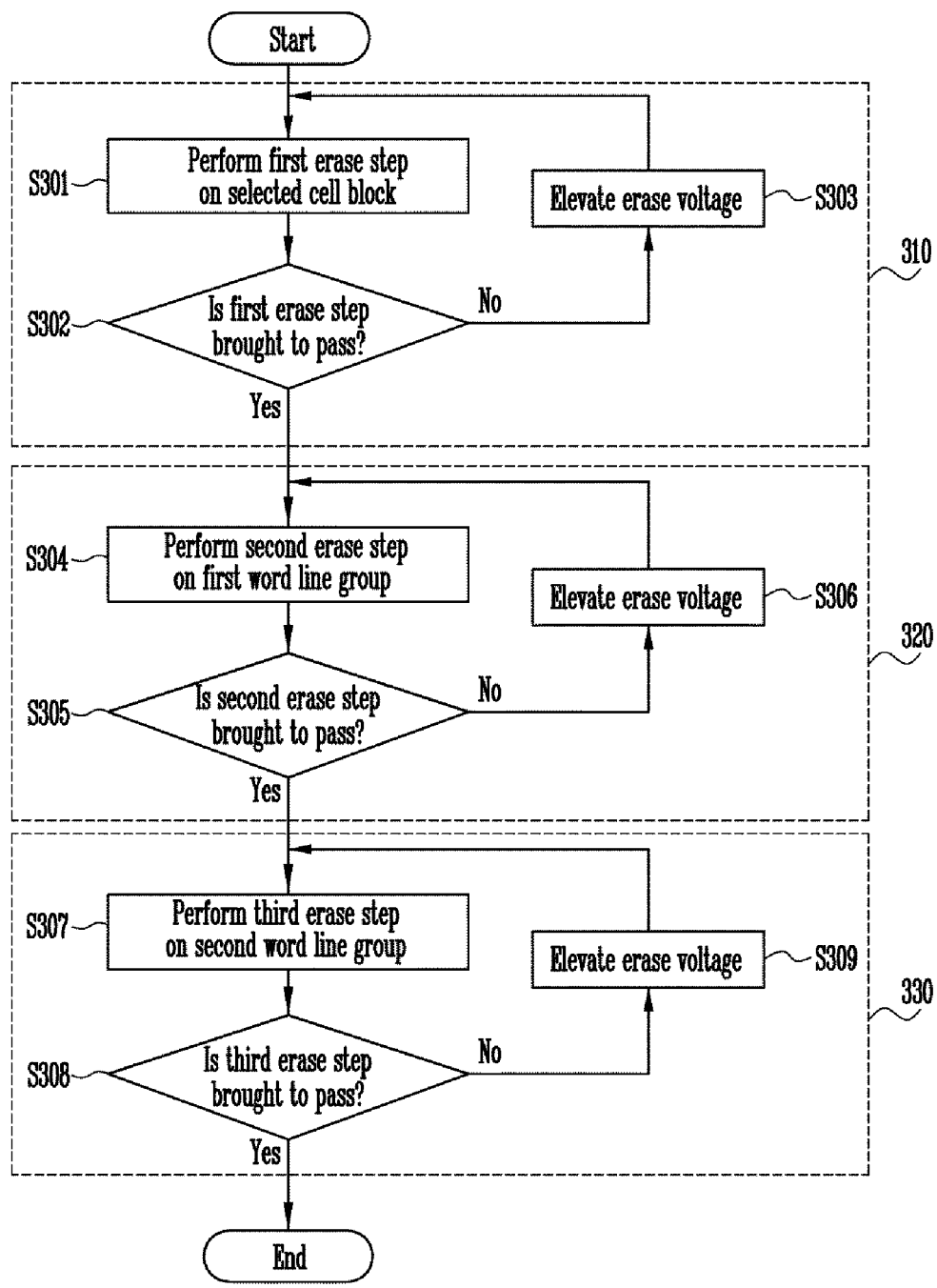

SEMICONDUCTOR MEMORY DEVICE AND METHOD OF OPERATING THE SAME

CROSS-REFERENCE TO RELATED APPLICATION

This application claims priority to Korean Patent Application No. 10-2011-0140195, filed on Dec. 22, 2011, the disclosure of which is incorporated herein by reference in its entirety.

BACKGROUND

The present invention relates generally to a semiconductor memory device and a method of operating the same, and more specifically a semiconductor memory device designed for an erase operation, and a method of operating the same.

A semiconductor memory device may include a memory cell array in which data is stored, which may include a plurality of memory cell blocks, which in turn may include a plurality of cell strings in which memory cells are included. Memory cells included in different cell strings may be connected to a plurality of word lines, and those connected to the same word line may be called a page. Accordingly, one memory cell block may include the same number of pages as word lines.

A semiconductor memory device may perform an erase operation on one memory cell block selected out of a plurality of memory cell blocks. An erase operation may be performed when a ground voltage (about 0V) is applied to all word lines of the selected memory cell block, which are floating, and an erase voltage is applied to a well of the selected memory cell block.

To improve the distribution of threshold voltages of memory cells, an erase operation has been performed by gradually elevating the erase voltage using an incremental step pulse erase (ISPE) process. While an ISPE erase operation contributes towards improving the distribution of threshold voltages of memory cells, there is a limitation for improving the distribution of threshold voltages of erased memory cells due to the increase in integration density of semiconductor memory devices.

SUMMARY OF THE INVENTION

The present invention is directed to a semiconductor memory device and a method of operating the same, which may improve the distribution of erase threshold voltages.

An embodiment of the present invention provides a method of operating a semiconductor memory device, including: performing an overall erase operation such that each threshold voltage of all memory cells connected to even word lines and odd word lines in a selected memory cell block becomes lower than a first target level, performing an erase operation such that each threshold voltage of the memory cells connected to the even word lines becomes lower than a second target level, and performing an erase operation such that each threshold voltage of the memory cells connected to the odd word lines becomes lower than the second target level, wherein the second target level is lower than the first target level.

Another embodiment of the present invention provides a semiconductor memory device including: a memory cell block including a plurality of memory cells connected to even word lines and odd word lines, a circuit group configured to perform an erase operation on the memory cells, and a control circuit configured to control the circuit group to erase the memory cells connected to the even and odd word lines during the erase operation.

Another embodiment of the present invention provides a semiconductor memory device including: a memory cell block including a plurality of memory cells connected to even word lines and odd word lines, a circuit group configured to perform an erase operation on the memory cells, and a control circuit configured to control the circuit group to lower each threshold voltage of all memory cells included in the memory cell block to at most the first target level, lower each of the threshold voltages of the memory cells connected to the even word lines to at most the second target level, and lower each of the threshold voltages of the memory cells connected to the odd word lines to at most the second target level, wherein the second target level is lower than the first target level.

BRIEF DESCRIPTION OF THE DRAWINGS

The above and other features as well as advantages of the present invention will become more apparent to those of ordinary skill in the art by describing in detail various embodiments thereof with reference to the attached drawings in which:

FIG. 3 is a flowchart illustrating an erase method according to an embodiment of the present invention.

DETAILED DESCRIPTION OF EMBODIMENTS

The present invention will be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure is thorough and complete and fully conveys the scope of the present invention to one skilled in the art.

Figure 1:
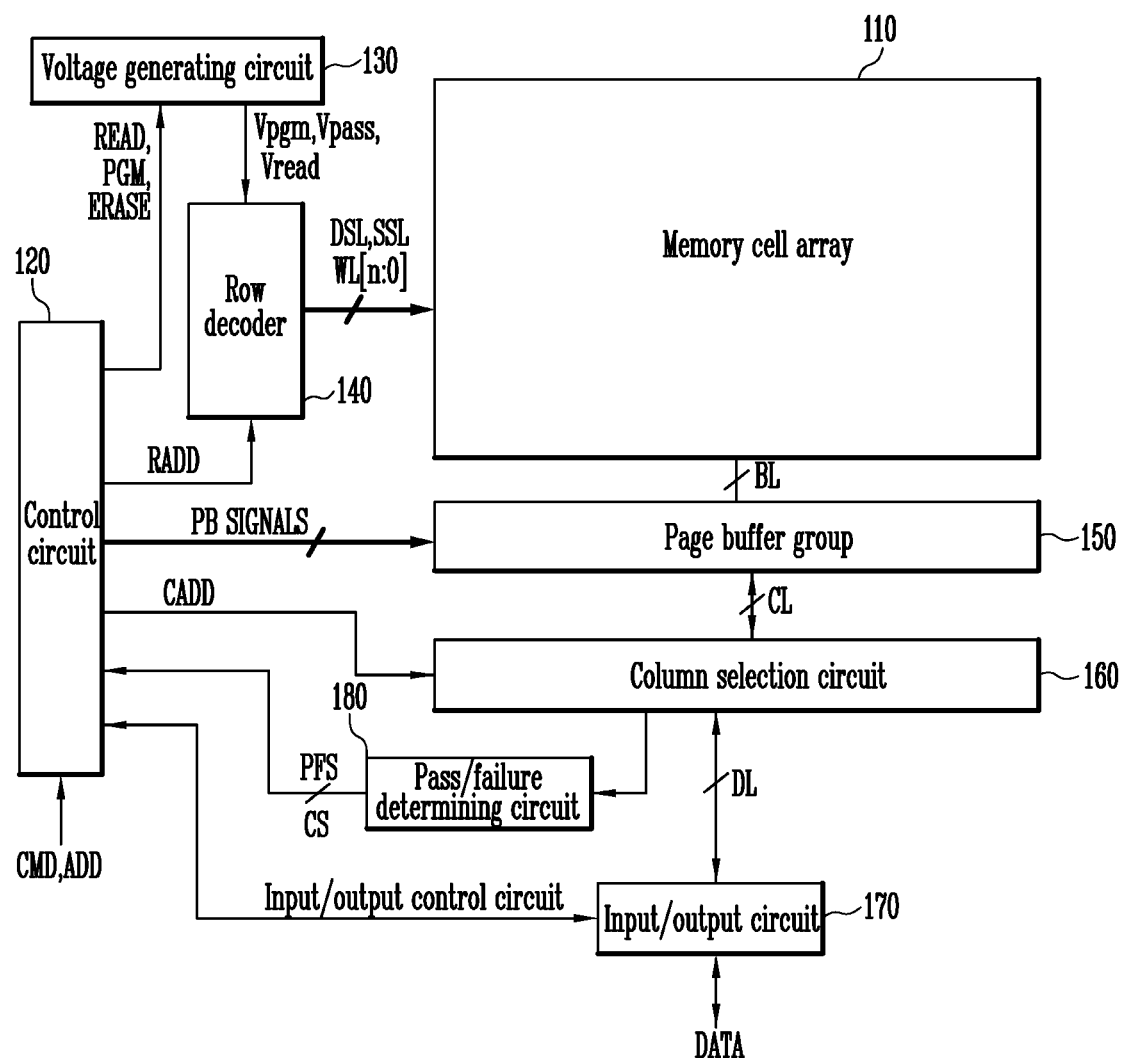
FIG. 1 is a block diagram of a semiconductor memory device, illustrating an erase method according to an embodiment of the present invention.

FIG. 1 is a block diagram of a semiconductor memory device, illustrating an erase method according to an embodiment of the present invention.

Referring to FIG. 1, the semiconductor memory device may include a memory cell array 110 and a control circuit 120 that controls control circuit groups 130-180 configured to perform a program, read, or erase operation on memory cells included in the memory cell array 110 to set threshold voltage levels of selected memory cells according to input data.

In a NAND flash device, a circuit group may include a voltage generating circuit 130, a row decoder 140, a page buffer group 150, a column selection circuit 160, an input/output (I/O) circuit 170, and a pass/failure determining circuit 180.

The memory cell array 110 may include a plurality of memory cell blocks, each of which may include a plurality of cell strings in which memory cells are included, which in turn may be connected to a plurality of word lines. Memory cells connected to the same word line may be called a page. A specific configuration of each of the memory cell blocks will be described with reference to FIG. 2.

The control circuit 120 may internally output a program operation signal PGM, a read operation signal READ, or an erase operation signal ERASE in response to a command signal CMD, and page buffer signals PB SIGNALS required to control page buffers included in the page buffer group 150. The control circuit 120 may internally output a row address signal RADD and a column address signal CADD in response to an address signal ADD. Furthermore, the control circuit 120 may determine whether each threshold voltage of selected memory cells reaches a target level in response to a check signal CS output by the pass/failure determining circuit 180 during a program operation or erase verification operation, and determine whether a program or erase operation is to be re-performed or complete.

In particular, the control circuit 120 may control the circuit groups 130, 140, 150, 160, 170, and 180 according to a program operation, a read operation, or an erase operation. In particular, during the erase operation, the control circuit 120 may control the circuit groups 130, 140, 150, 160, 170, and 180 such that after memory cells included in an even or odd word line group are erased, memory cells included in the remaining word line group are erased.

The voltage generating circuit 130 may output operation voltages required for programming, reading, or erasing memory cells to global lines in response to operation signals PGM, READ, and ERASE, which are internal command signals of the control circuit 120. When memory cells are to be programmed, the voltage generating circuit 130 may output operation voltages (e.g., Vpgm, Vpass, and Vread) required for the program operation to the global lines.

The row decoder 140 may transmit operation voltages generated by the voltage generating circuit 130 to local lines DSL, SSL, and WL[n:0] of a selected memory block in response to row address signals RADD of the control circuit 120.

The page buffer group 150 may detect a program state or erase state of memory cells, and may include a plurality of page buffers connected respectively to bit lines BL of the memory cell array 110. The page buffer group 150 may apply voltages required for storing data in the memory cells of the memory cell array 110 to the respective bit lines BL in response to the page buffer signals PB SIGNALS output by the control circuit 120. Specifically, the page buffer group 150 may precharge the bit lines BL during the program, erase, or read operation of the memory cells, or latch data corresponding to a threshold voltage level of the memory cells, which may be detected according to a variation in the voltage of the bit lines BL. For example, during the program operation, the page buffer group 150 may apply a program permission voltage, such as 0V or a program prohibition voltage such as Vcc to the bit lines BL according to data input to a latch. During the read operation, the page buffer group 150 may detect a varied voltage of the bit lines BL according to data stored in the memory cells, and read the data stored in the memory cells. During the erase operation, the page buffer group 150 may apply an erase permission voltage, such as Vcc to the bit lines BL.

The column selection circuit 160 may select page buffers included in the page buffer group 150 through column lines CL in response to the column address signal CADD output by the control circuit 120, receive data latched in the selected page buffers through column lines CL, and transmit the latched data to the pass/failure determining circuit 180.

To input externally applied data DATA to the page buffers of the page buffer group 150 during the program operation, the I/O circuit 170 may transmit the data DATA to the column selection circuit 160 under the control of the control circuit 120. The column selection circuit 160 may sequentially transmit the received data DATA to the page buffers of the page buffer group 150, and the page buffers may store the received data DATA in respective internal latches. During the read operation, the I/O circuit 170 may externally output the data DATA transmitted from the page buffers of the page buffer group 150 through the column selection circuit 160.

The pass/failure determining circuit 180 may output the determination result as the check signal CS to each of the cell strings according to data input during a verification operation performed after a program or erase operation, or output a pass/fail signal (PFS) for a program or erase operation of memory cells connected to a selected word line.

Figure 2:
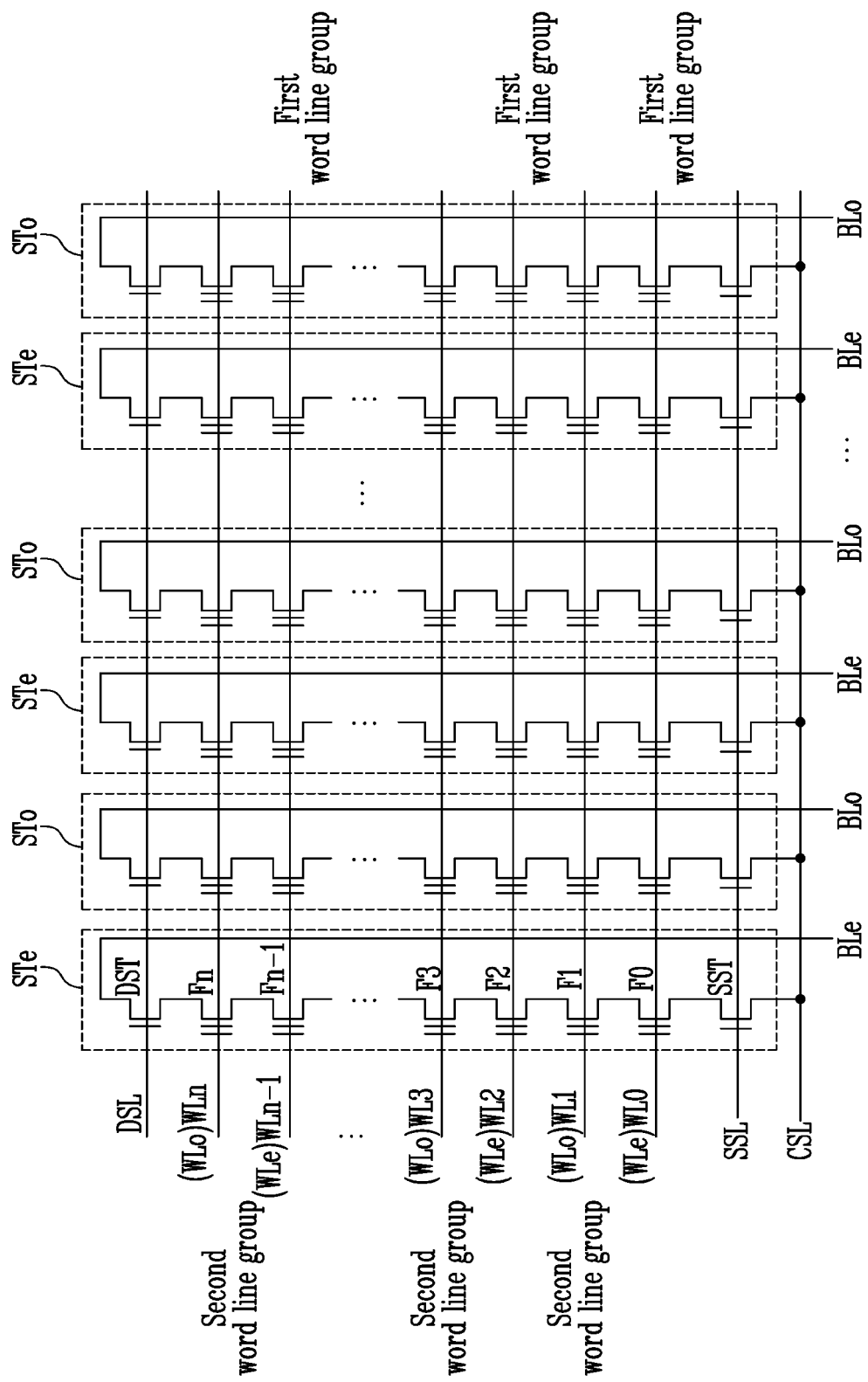
FIG. 2 is a specific circuit diagram of a memory cell array of FIG. 1.

FIG. 2 is a specific circuit diagram of the memory cell array 110 of FIG. 1.

Referring to FIG. 2, since the memory cell array 110 may include a plurality of memory cell blocks having the same configuration, only one of the plurality of memory cell blocks is presented.

The memory cell block may include a plurality of cell strings STe and STo. Some of the cell strings STe and STo may be designated as main strings in which program data is stored, while some of the remaining strings STe and STo may be designated as flag strings in which data required for operations is stored. Cells included in each of the flag strings may have the same configuration as memory cells. For brevity, FIG. 2 illustrates only the main strings. The cell strings STe and STo may be classified into even-numbered cell strings STe or odd-numbered cell strings STo according to the order of disposition thereof, and may have the same configuration. Each of the even and odd cell strings STe and STo may include a source selection transistor SST connected to a common source line CSL, a plurality of memory cells F0 to Fn, and a drain selection transistor DST connected to an even or odd bit line BLe or BLo. A bit line connected to the even cell string STe may be called an even bit line BLe, while a bit line connected to the odd cell string STo may be called an odd bit line BLo. Gates of source selection transistors SST included in the even and odd cell strings STe and STo may be connected commonly to a source selection line SSL, gates of memory cells F0 to Fn included in the even and odd cell strings STe and STo may be respectively connected commonly to word lines WL0 to WLn, and gates of drain selection transistors DST included in the even and odd cell strings STe and STo may be connected commonly to a drain selection line DSL.

Among the word lines WL0 to WLn, even-numbered word lines WL0, WL2, . . . , and WLn may be called even word lines WLe, while odd-numbered word lines WL1, WL3, . . . , and WLn−1 may be called odd word lines WLo. Thus, in the embodiments of the present invention, all the even word lines WLe of a selected memory cell block may fall into one group and be designated as a first word line group, the remaining odd word lines WLo may fall into another group and be designated as a second word line group, and an erase operation may be performed on each of the first and second word line groups. A specific erase method will now be described.

FIG. 3 is a flowchart illustrating an erase method according to an embodiment of the present invention.

Referring to FIG. 3, an erase operation may include sequentially performing an overall erase operation 310 of the selected memory cell block, a first word line group erase operation 320 of the selected memory cell block, and a second word line group erase operation 330 of the the selected memory cell block. The first word line group erase operation 320 and the second word line group erase operation 330 may be performed in the reverse order. Each of the erase operations 310, 320, and 330 may be performed by continuously applying an erase voltage to a well of a selected memory cell block for a long period of time or using an incremental step pulse erase (ISPE) process of gradually elevating an erase voltage to reduce the distribution width of threshold voltages.

The overall erase operation 310 may include repeating a first erase step S301, a first erase verification step S302, and an erase voltage elevation step S303 until each threshold voltage of all the memory cells of the selected memory cell block becomes lower than a first target level. Each of the steps S301, S302, and S303 will now be described in detail.

In the first erase step S301, a memory cell block to be erased may be selected, a voltage having a ground level may be applied to all word lines (refer to WLe and WLo of FIG. 2) of the selected memory cell block, and an erase voltage may be applied to the well of the selected memory cell block.

In the first erase verification step S302, each threshold voltage of all the memory cells of the selected memory cell block are verified to check if it the voltages are lower than the first target level, which may be set within a range from about 0V to about −1V, but preferably set to about 0V. Specifically, all the bit lines (refer to BLe and BLo of FIG. 2) may be precharged, a first verification voltage may be applied to all the word lines (refer to WLe and WLo of FIG. 2) of the selected memory cell block, and each threshold voltage of all the memory cells are verified to check if the voltages are lower than the first target level by examining the states of the memory cells in the bit lines BLe and BLo.

When a threshold voltage of at least one memory cell does is not lower than the first target level and it is determined that the verification result is a failure in the first erase verification step S302, an erase voltage may be elevated by as much as a step voltage and may be applied to the well of the selected memory cell block to re-perform the first erase step S301. In the above-described manner, the steps S301, S302, and S303 may be repeated until each of the threshold voltages of all the memory cells of the selected memory cell block are lower than the first target level, at which time the first word line group erase operation 320 or the second word line group erase operation 330 may be performed.

The first word line group erase operation 320 may include selecting word lines among all word lines of the selected memory cell block, and performing an erase operation and an erase verification operation on memory cells connected to the selected word lines. The first word line group may comprise of even word lines WLe of the word lines of the selected memory cell block. The first word line group erase operation 320 may include repeating a second erase step S304, a second erase verification step S305, and an erase voltage elevation step S306 until each threshold voltage of all memory cells connected to the first word line group are lower than a second target level which is lower than the first target level. Each of the steps S304, S305, and S306 will now be described in detail.

In the second erase step S304, to erase only memory cells connected to even word lines (refer to WLe of FIG. 2), a voltage having a ground level may be applied to the even word lines (refer to WLe of FIG. 2), and the remaining odd word lines (refer to WLo of FIG. 2) may be floating. Thereafter, threshold voltages of all the memory cells connected to the first word line group may be lowered by applying an erase voltage to the well of the selected memory cell block.

In the second erase verification step S305, each threshold voltage of all the memory cells connected to the first word line group are verified to check if the voltages are lower than the second target level, which may be set within a range lower than the first target level. Preferably, the second target level may be set to a level lower than about −2V considering a margin between the first target level of the overall erase operation 310 and the second target level. For brevity, the second target level is set to about −2V in the present embodiment. However, the second target level may be different under conditions of lower first target levels depending on memory devices. Specifically, the second erase verification step S305 may include precharging all the bit lines (refer to BLe and BLo of FIG. 2), applying a verification voltage (e.g., about −2V) corresponding to the second target level to the even word lines (refer to WLe of FIG. 2), applying a verification pass voltage (e.g., about 5V) to the remaining odd word lines (refer to WLo of FIG. 2), and verifying whether each threshold voltage of the memory cells connected to the first word line group are lower than the second target level by examining the states of the memory cells connected to the even word lines WLe on the bit lines BLe and BLo.

When it is determined in the second erase verification step S305 that a threshold voltage of at least one of the memory cells connected to the first word line group is not lower than the second target level, an erase voltage may be elevated by as much as a step voltage, and may be applied to the well of the selected memory cell block to re-perform the second erase step S304 on the memory cells of the first word line group. In the above-described manner, steps S304, S305, and S306 may be repeated until each threshold voltage of all the memory cells connected to the first word line group of the memory cell block are lower than the second target level, at which time the second word line group erase operation 330 may be performed on the remaining word line group.

The second word line group erase operation 330 may be performed on all the memory cells connected to the odd word lines WLo except the even word lines WLe, and an erase operation and an erase verification operation may be performed on all the memory cells connected to the second word line group. The second word line group erase operation 330 may include repeating a third erase step S307, a third erase verification step S308, and an erase voltage elevation step S309 until each threshold voltage of all the memory cells connected to the second word line group are lower than the second target level. Each of the steps S307, S308, and S309 will now be described in detail.

In the third erase step S307, to perform an erase operation and an erase verification operation only on the memory cells connected to the odd word lines WLo, a voltage having a ground level may be applied to the odd word lines (refer to WLo of FIG. 2), and the remaining even word lines (refer to WLe of FIG. 2) may be floating. Thereafter, an erase voltage may be applied to the well of the selected memory cell block to lower threshold voltages of all the memory cells connected to the second word line group.

In the third erase verification step S308, each threshold voltage of all the memory cells of the second word line group are verified to check if the voltages are lower than the second target level, which may be set to the same level as the target level of the second word line group erase operation 320. Specifically, the third erase verification step S308 may include precharging all the bit lines (refer to BLe and BLo of FIG. 2), applying a verification voltage (e.g., about −2V) corresponding to the second target level to the odd word lines (refer to WLo of FIG. 2), applying a verification pass voltage (e.g., about 5V) to the remaining even word lines (refer to WLe of FIG. 2), and verifying whether each threshold voltage of the memory cells connected to the second word line group are lower than the second target level by examining the states of the memory cells connected to the odd word lines WLo in the bit lines BLe and BLo.

When it is determined in the third erase verification step S308 that a threshold voltage of at least one of the memory cells connected to the second word line group is not lower than the second target level, an erase voltage may be elevated by as much as a step voltage, and may be applied to the well of the selected memory cell block to re-perform the third erase step S307 on the memory cells of the second word line group. In the above-described manner, steps S307, S308, and S309 may be repeated until each threshold voltage of all the memory cells included in the second word line group of the memory cell block are lower than the second target level, at which time the erase operation of the selected memory cell block may be completed.

Figure 4A:
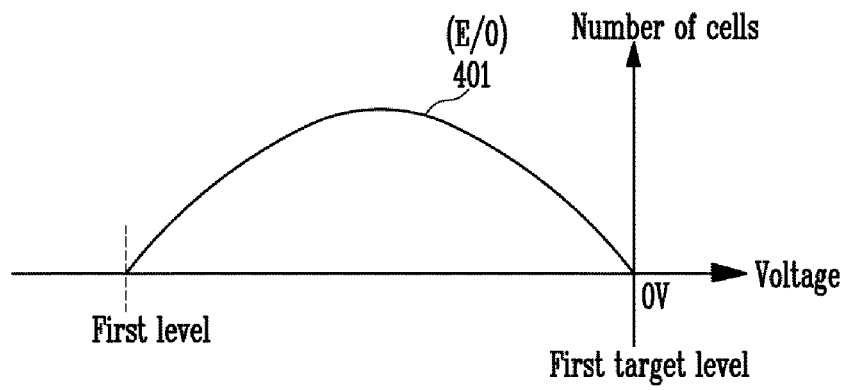
FIGS. 4A through 4C are graphs showing threshold voltages of memory cells following an erase method according to an embodiment of the present invention.
Figure 4B:
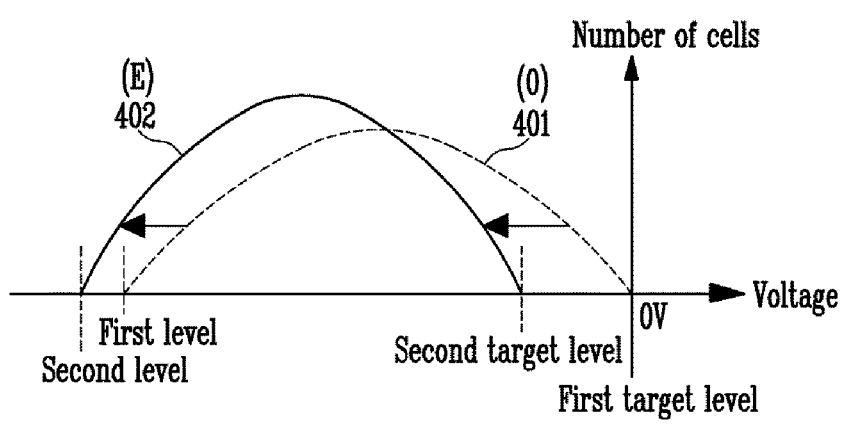
Figure 4C:
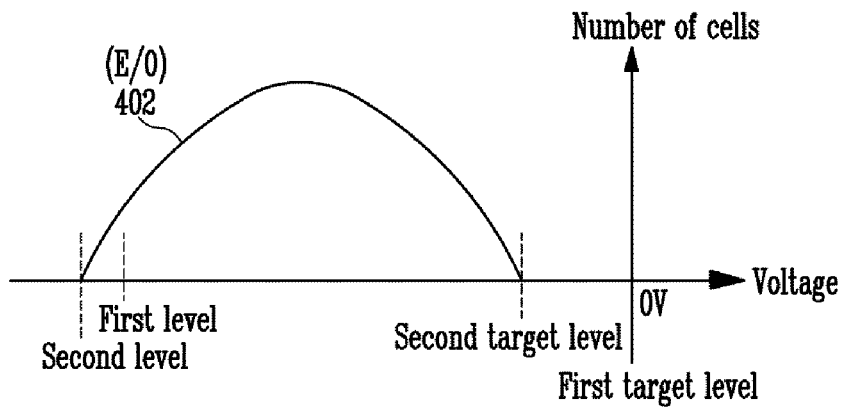

FIGS. 4A through 4C are graphs showing threshold voltages of memory cells according to an erase method based on an embodiment of the present invention.

FIG. 4A illustrates the distribution of threshold voltages of the memory cells in the overall erase step 310 described with reference to FIG. 3, FIG. 4B illustrates the distribution of threshold voltages of the memory cells in the first word line group erase step 320 described with reference to FIG. 3, and FIG. 4C illustrates the distribution of threshold voltages of the memory cells in the second word line group erase step 330 described with reference to FIG. 3.

Referring to FIG. 4A, when the overall erase step 310 of the selected memory cell block is complete as described above with reference to FIG. 3, each memory cell E/O included in a selected memory cell block may have a first threshold voltage distribution 401 lower than a first target level. Threshold voltages of memory cells E connected to even word lines WLe and memory cells O connected to odd word lines WLo in the selected memory cell block may be distributed along the first threshold voltage distribution 401, between a first level having the lowest threshold voltage and the first target level having the highest threshold voltage.

Referring to FIG. 4B, when the first word line group erase step 320 is complete as described above with reference to FIG. 3, the memory cells E connected to the even word lines WLe out of the memory cells of the selected memory cell block may have a second threshold voltage distribution 402 that is lower than the first threshold voltage distribution 401. In this case, threshold voltages of the memory cells O connected to the odd word lines WLo may maintain the first threshold voltage distribution 401, or be distributed between the first threshold voltage distribution 401 and the second threshold voltage distribution 402.

In the second threshold voltage distribution 402 of the memory cells E connected to the even word lines WLe, a threshold voltage level of a cell having the lowest threshold voltage may be referred to as a second level, and a threshold voltage level of a cell having the highest threshold voltage may be referred to as a second target level. Since all the memory cells are affected by an erase voltage having the same level during the erase operation, a cell having a higher voltage level may have a greater variation width in threshold voltage than a cell having a lower voltage level. The difference in threshold voltage between cells having the highest levels, which may be equal to a value obtained by subtracting the second target level from the first target level, may be greater than the difference in threshold voltage between cells having the lowest levels, which may be equal to a value obtained by subtracting the second level from the first level. Accordingly, the threshold voltage distribution 402 of the memory cells E of the first word line group may have a smaller width than the threshold voltage distribution 401 of the memory cells O of the second word line group.

Referring to FIG. 4C, when the second word line group erase operation 330 is complete as described above with reference to FIG. 3, the memory cells O connected to the odd word lines WLo, among the memory cells of the selected memory cell block, may also have the second threshold voltage distribution 402. Accordingly, all the memory cells of the selected memory cell block may have the second threshold voltage distribution 402 with a smaller width than the first threshold voltage distribution 401.

When the width of the threshold voltage distribution of the erased memory cells is reduced as described above, the variation width of a threshold voltage may be reduced during a subsequent program operation, thereby improving the distribution of threshold voltages during the program operation.

According to the present invention, a plurality of word lines of a memory cell block may be classified into groups, and an erase operation may be performed on each word line group, thereby improving the distribution of erase threshold voltages. Accordingly, the distribution of program threshold voltages of memory cells may be improved during a subsequent program operation.

In the drawings and specification, various embodiments of the invention have been disclosed, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of operating a semiconductor memory device, the method comprising:
   performing an overall erase operation such that each threshold voltage of all memory cells connected to even word lines and odd word lines in a selected memory cell block are lower than a first target level;
   performing an erase operation such that each threshold voltage of the memory cells connected to the even word lines are lower than a second target level; and
   performing an erase operation such that each threshold voltage of the memory cells connected to the odd word lines are lower than the second target level, wherein the second target level is lower than the first target level.

2. The method of claim 1, wherein the overall erase operation includes repeating a first erase step, a first erase verification step, and an erase voltage elevation step until each threshold voltage of all the memory cells of the selected memory cell block are lower than the first target level.

3. The method of claim 2, wherein the first erase step includes applying a voltage having a ground level to all word lines of the selected memory cell block, and applying an erase voltage to a well of the selected memory cell block.

4. The method of claim 2, wherein the first erase verification step includes precharging all bit lines of the selected memory cell block, applying a first verification voltage to all word lines of the selected memory cell block, and verifying whether each threshold voltage of all the memory cells are lower than the first target level by examining the states of all the memory cells in the bit lines.

5. The method of claim 2, wherein the erase voltage elevation step includes elevating an erase voltage by as much as a step voltage when it is determined in the first erase verification step that a threshold voltage of at least one of the memory cells is not lower than the first target level.

6. The method of claim 1, wherein the performing of the erase operation on the memory cells connected to the even word lines comprises repeating a second erase step, a second erase verification step, and an erase voltage elevation step until each threshold voltage of all the memory cells connected to the even word lines are lower than the second target level.

7. The method of claim 6, wherein the second erase step comprises applying a voltage having a ground level to the even word lines of the selected memory cell block, floating the remaining odd word lines, and applying an erase voltage to a well of the selected memory cell block.

8. The method of claim 6, wherein the second erase verification step comprises precharging all bit lines of the selected memory cell block, applying a verification voltage corresponding to the second target level to the even word lines, applying a verification pass voltage to the remaining odd word lines, and verifying whether each threshold voltage of the memory cells connected to the even word lines are lower than the second target level by examining the states of the memory cells connected to the even word lines in the bit lines.

9. The method of claim 6, wherein the erase voltage elevation step includes elevating an erase voltage by as much as a step voltage when it is determined in the second erase verification step that a threshold voltage of at least one of the memory cells connected to the even word lines is not lower than the second target level.

10. The method of claim 1, wherein the performing of the erase operation on the memory cells connected to the odd word lines comprises repeating a third erase step, a third erase verification step, and an erase voltage elevation step until each threshold voltage of all the memory cells connected to the odd word lines are lower than the second target level.

11. The method of claim 10, wherein the third erase step includes applying a voltage having a ground level to the odd word lines of the selected memory cell block, floating the remaining even word lines, and applying an erase voltage to a well of the selected memory cell block.

12. The method of claim 10, wherein the third erase verification step includes precharging all bit lines of the selected memory cell block, applying a verification voltage corresponding to the second target level to the odd word lines, applying a verification pass voltage to the remaining even word lines, and verifying whether each threshold voltage of the memory cells connected to the odd word lines are lower than the second target level by examining the states of the memory cells connected to the odd word lines in the bit lines.

13. The method of claim 10, wherein the erase voltage elevation step comprises elevating an erase voltage by as much as a step voltage when it is determined in the third erase verification step that a threshold voltage of at least one of the memory cells connected to the odd word lines is not lower than the second target level.

14. The method of claim 1, wherein the first target level is set within a range from 0V to −1V, and the second target level is set within a range of lower than −1V.

15. The method of claim 1, wherein the overall erase operation of repeating a first erase step, a first erase verification step, and an erase voltage until each threshold voltage of all the memory cells of the selected memory cell block are lower than the first target level and the overall erase operation of repeating a second erase step, a second erase verification step, and an erase voltage until each threshold voltage of all the memory cells of the selected memory cell block are lower than the second target level may be performed in the reverse order.

16. A semiconductor memory device comprising:
a memory cell block including a plurality of memory cells connected to even word lines and odd word lines;
a circuit group configured to perform an erase operation on the memory cells; and
a control circuit configured to control the circuit group to erase memory cells connected to the even word lines and then erase memory cells connected to the odd word lines during the erase operation.

17. A semiconductor memory device comprising:
a memory cell block including a plurality of memory cells connected to even word lines and odd word lines;
a circuit group configured to perform an erase operation on the memory cells; and
a control circuit configured to control the circuit group to lower each threshold voltage of all memory cells included in the memory cell block to at most the first target level, lower each threshold voltage of the memory cells connected to the even word lines to at most second target level, and lower each threshold voltage of the memory cells connected to the odd word lines to at most the second target level, wherein the second target level is lower than the first target level.

18. The device of claim 17, wherein the control circuit controls the circuit group to further perform an overall erase operation on all the memory cells included in the memory cell block before performing the erase operation on the memory cells connected to the even or odd word lines.

19. The device of claim 18, wherein the control circuit controls the circuit group such that each threshold voltage of all the memory cells are lower than the first target level during the overall erase operation, and controls the circuit group such that each threshold voltage of the memory cells connected to selected word lines are lower than the second target level,
wherein the second target level is lower than the first target level.

20. The device of claim 17, wherein the circuit group comprises:
a voltage generating circuit configured to generate operation voltages required for a program operation, a read operation, or an erase operation in response to operation signals corresponding to internal command signals of the control circuit, and to output the operation voltages to global lines;
a row decoder configured to transmit the operation voltages generated by the voltage generating circuit to local lines of a selected memory cell block;
a page buffer group configured to detect program or erase states of the memory cells, precharge bit lines connected to the memory cell block during the program operation, the read operation, or the erase operation, or latch data corresponding to threshold voltage levels of the detected memory cells according to a variation in voltage of the bit lines;
a column selection circuit configured to select a plurality of page buffers included in the page buffer group; and
an input/output (I/O) circuit configured to transmit externally input data to the column selection circuit, or externally output data transmitted from the column selection circuit.

* * * * *